United States Patent
Nishioka

(10) Patent No.: US 6,545,528 B2
(45) Date of Patent: Apr. 8, 2003

(54) SEMICONDUCTOR DEVICE

(75) Inventor: Naohisa Nishioka, Tokyo (JP)

(73) Assignees: NEC Corporation, Tokyo (JP); NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/923,576

(22) Filed: Aug. 7, 2001

(65) Prior Publication Data

US 2002/0024881 A1 Feb. 28, 2002

(30) Foreign Application Priority Data

Aug. 8, 2000  (JP) ....................... 2000-240218

(51) Int. Cl.[7] ................................ G05E 1/10
(52) U.S. Cl. ........................ 327/530; 327/535
(58) Field of Search ................ 365/189.09, 189.12, 365/194, 226, 230.06, 233, 225.7, 189.08; 327/530, 535

(56) References Cited

U.S. PATENT DOCUMENTS

| | | | | |
|---|---|---|---|---|
| 5,903,513 A | * | 5/1999 | Itou | 365/233 |
| 6,081,142 A | * | 6/2000 | Douchi et al. | 327/158 |
| 6,239,631 B1 | * | 5/2001 | Fujioka et al. | 327/141 |
| 6,366,506 B1 | * | 4/2002 | Mizuno et al. | 365/226 |
| 6,400,643 B1 | * | 6/2002 | Setogawa | 365/233 |

FOREIGN PATENT DOCUMENTS

| | | |
|---|---|---|
| JP | 5-119876 | 5/1993 |
| JP | 7-201175 | 8/1995 |

OTHER PUBLICATIONS

English abstracts for the above referenced Japanese publications.

* cited by examiner

*Primary Examiner*—Trong Phan
(74) *Attorney, Agent, or Firm*—Darryl G. Walker; Bradley T. Sako

(57) ABSTRACT

A semiconductor device having an internal voltage, signal timing, and logic current supply determined by a desired operating frequency is disclosed. The semiconductor device may include a register (1100) that may store a code value received externally during a code setting operation. A decoder (1200) may decode the code value and provide decoded signals (D1 to D4) to an internal power source circuit (1300), internal logic circuit system (1400), and a sense amp system (1500). The internal power source circuit (1300) may generate a power supply voltage based on the code value. The internal logic circuit system (1400) may be coupled to receive the power supply voltage and may generate a signal delay based on the code value. The sense amp system (1500) may be coupled to receive the power supply voltage and may have a operating current based on the code value. In this way, signal timings may be improved and power consumption may be reduced.

20 Claims, 10 Drawing Sheets

| WORKING FREQUENCY (f) | f1 | f2 | f3 | f4 | f5 | f6 | f7 | f8 |
|---|---|---|---|---|---|---|---|---|
| REG1 | 0 | 0 | 0 | 0 | 1 | 1 | 1 | 1 |
| REG2 | 0 | 0 | 1 | 1 | 0 | 0 | 1 | 1 |
| REG3 | 0 | 1 | 0 | 1 | 0 | 1 | 0 | 1 |
| Vint (V) | 2.0 | 2.0 | 2.0 | 2.0 | 1.9 | 1.9 | 1.9 | 1.8 |
| Ic (mA) | 3 | 3 | 3 | 3 | 1 | 1 | 1 | 1 |
| tDLY (ns) | +0.5 | +0.5 | +0.5 | 0 | 0 | −0.5 | −0.5 | −0.5 |

(EXTERNAL POWER SOURCE VOLTAGE = 2.5V)

FIG. 11

SEMICONDUCTOR DEVICE

TECHNICAL FIELD

The present invention relates to a semiconductor device and more particularly, to a semiconductor device such as a Rambus DRAM (Dynamic Random Access Memory) or the like which may have a plurality of operational frequencies with which circuit operation may be implemented in a manner appropriate to each operational frequency.

BACKGROUND OF THE INVENTION

Semiconductor devices may be specifically guaranteed by a specification to reliably function at a plurality of operational frequencies. One such type of a device is a Rambus Dynamic Random Access Memory (RDRAM).

Referring now to FIG. 1, a block schematic diagram of a Rambus DRAM is set forth and given the general reference character 100.

Rambus DRAM 100 includes a high-speed interface section 110 and a core section 120. High-speed interface section 110 has a high frequency data transfer speed and includes a register for setting the operating frequency. The phase difference between the input and output signals of the high-speed interface section 110 is compensated by setting a desired operating frequency in the register. This can help make high frequency operation possible. Core section 120 is a DRAM including banks, which have a protocol that is compatible for data transfer via high-speed interface section 110. The core section 120 operates at the same operational speed as a conventional DRAM.

However, with the Rambus DRAM 100 described above, the power supply voltage of core section 120 is kept constant irrespective of the selected operating frequency set in the register of the high-speed interface section 110. The power supply voltage is typically selected so that the most appropriate operating condition can be adequately achieved. Generally, the operating speed of a circuit is dependent upon the power supply voltage. The power supply voltage for core section 120 is typically set to allow the maximum allowable operating frequency because the greater the power supply voltage the greater the operating speed becomes.

However, when the operating frequency becomes lower, high operational speed for core section 120 may no longer be necessary and it may no longer be necessary to keep the power supply voltage at a high level. Also, current consumption is dependent upon the power supply voltage. The higher the power supply voltage, the higher the current consumption. Accordingly, if the power supply voltage is kept higher than necessary when the operating frequency is low, excessive current is consumed.

It may be considered to lower the voltage of the internal power supply for core section 120 when the operating frequency is low in order to decrease current consumption. However, if the internal power supply voltage is reduced, the relative timing relationship between various signals may not be maintained. This is because propagation delay of signals in various circuits in core section 120 may vary with respect to voltage variations. When these signals have critical timings, functionality may be compromised. For this reason it is not feasible to simply lower the voltage of the internal power supply in core section 120.

In view of the above discussion, it would be desirable to provide a semiconductor device, which can change the internal power supply voltage according to the operating frequency while maintaining relative timing relationships between various signals. It would also be desirable to suppress excess current consumption in a semiconductor device as the operating frequency decreased.

SUMMARY OF THE INVENTION

According to the embodiments of the present invention, a semiconductor device having an internal voltage, signal timing, and logic current supply determined by a desired operating frequency is disclosed. The semiconductor device may include a register that may store a code value received externally during a code setting operation. A decoder may decode the code value and provide decoded signals to an internal power source circuit, an internal logic circuit system, and a sense amp system. The internal power source circuit may generate a power supply voltage based on the code value. The internal logic circuit system may be coupled to receive the power supply voltage and may generate a signal delay based on the code value. The sense amp system may be coupled to receive the power supply voltage and may have a operating current based on the code value. In this way, signal timings may be improved and power consumption may be reduced.

According to one aspect of the embodiments, a semiconductor device may include a code setting section having a code, which may indicate a desired operating frequency. A power supply voltage section may select a power supply voltage level based on the code. A delay section may select a signal delay amount based on the code.

According to another aspect of the embodiments, the semiconductor device may include a current providing section, which selects a current value based on the code.

According to another aspect of the embodiments, the semiconductor device may include a control section coupled to receive the code and provide decoded signals to the power supply voltage section to select the power supply voltage and the delay section to select the delay amount.

According to another aspect of the embodiments, the power supply voltage section may include a plurality of transfer gates, which select between a plurality of power supply voltage levels based on the code value.

According to another aspect of the embodiments, the power supply voltage section may include a reference voltage generation section. The plurality of transfer gates may select between a plurality of power supply voltage levels by selecting a reference voltage based on the code value.

According to another aspect of the embodiments, the semiconductor device may include a control section coupled to receive the code and provide decoded signals to the power supply voltage section to select the power supply voltage level. Each of the plurality of transfer gates may include a transfer gate control terminal for controlling a transfer gate controllable impedance path. The power supply voltage section may include a switch section which couples the decoded signals to selected transfer gate control terminals while setting unselected transfer gate control terminals to a predetermined logic level.

According to another aspect of the embodiments, the transfer gate control terminals may be selected by a plurality of programmable devices.

According to another aspect of the embodiments, the transfer gate control terminals may be selected by a mask programmable conductive layer.

According to another aspect of the embodiments, the transfer gate control terminals may be selected by a plurality of programmable devices.

According to another aspect of the embodiments, the code may be externally received during a code setting operation.

According to another aspect of the embodiments, a semiconductor device may include a code setting section storing a code value indicating a desired device operating frequency. A power supply circuit may generate a power supply potential based on the code value. A logic circuit may receive the power supply potential and may modify the timing of a logic signal based on the code value.

According to another aspect of the embodiments, the timing of the logic signal may be determined by configuring a signal propagation delay path in accordance with the code value.

According to another aspect of the embodiments, the logic circuit may include a plurality of delay circuits providing different signal propagation delays. A plurality of switches may select at least one of the plurality of delay circuits based on the code value.

According to another aspect of the embodiments, a control section may be coupled to receive the code value and provide decoded signals coupled to the logic circuit to select at least one of the plurality of delay circuits.

According to another aspect of the embodiments, the logic signal may be a sense amplifier activation signal.

According to another aspect of the embodiments, a semiconductor device may include a code setting section outputting a code value indicating a desired device operating frequency. A power supply circuit may generate a power supply potential based on the code value. A first circuit may be connected to the power supply potential and may have an operating current based on the code value.

According to another aspect of the embodiments, the first circuit may include a plurality of current sources. A plurality of transfer gates may select one of the plurality of current sources based on the code value.

According to another aspect of the embodiments, each of the plurality of current sources includes an IGFET for supplying the operating current to the first circuit.

According to another aspect of the embodiments, the semiconductor device may include a control section coupled to receive the code value and provide decoded signals to the first circuit to select the operating current. The code setting section may include a register storing the code value.

According to another aspect of the embodiments, the first circuit may include a differential amplifier and the semiconductor device may be a semiconductor memory device.

BRIEF DESCRIPTION OF THE DRAWINGS

FIG. 11 is a table illustrating register values and values of an internal power supply voltage, a current supplied in a sense amp system, and a relative delay of a sense amp activation signal timing for various operating frequencies according to the second embodiment.

DETAILED DESCRIPTION OF THE EMBODIMENTS

Various embodiments of the present invention will now be described in detail with reference to a number of drawings.

Figure 1:
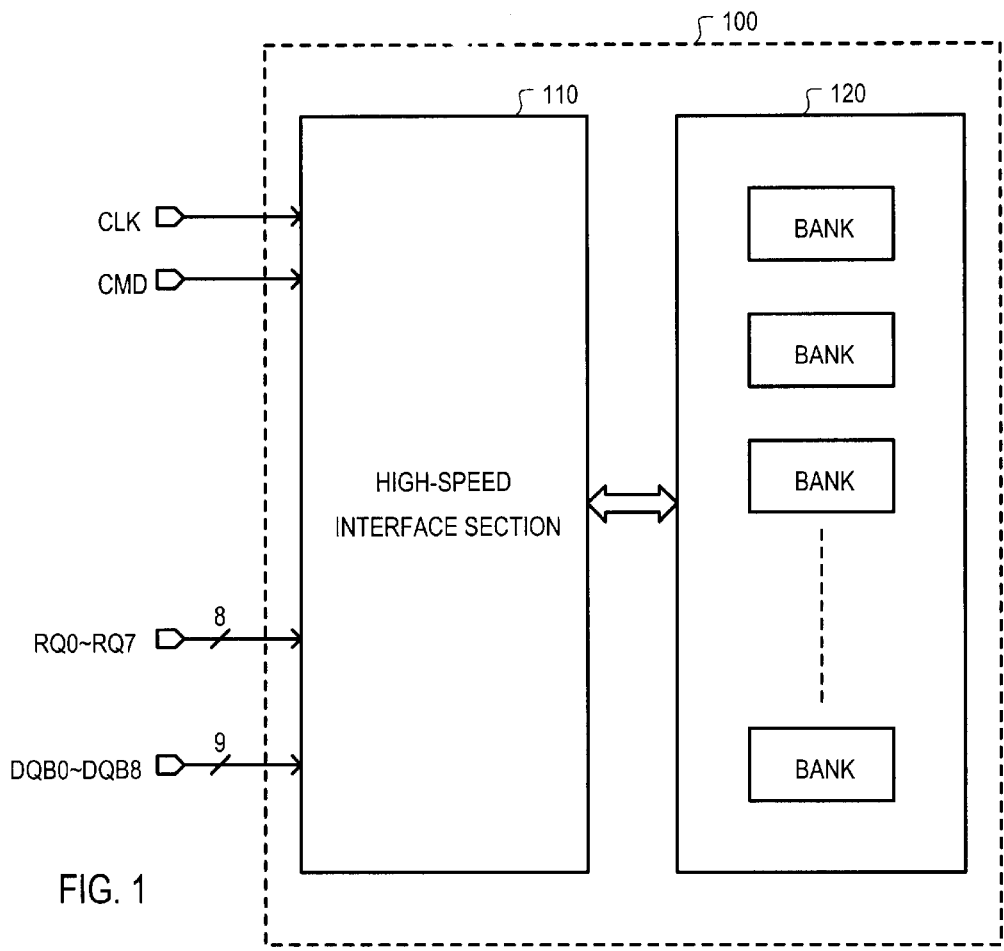
FIG. 1 is a block schematic diagram of a Rambus DRAM.

Referring now to FIG. 1, a block schematic diagram of a semiconductor device according to a first embodiment is set forth and given the general reference character 100.

The semiconductor device may be a Rambus Dynamic Random Access Memory (Rambus DRAM). Semiconductor device 100 may be compatible with a plurality of operating frequencies. Operating frequencies may be 600 MHz, 712 MHz, and 800 MHz, as just three examples. Semiconductor device 100 may include a high-speed interface section 110 and a core section 120.

High-speed interface section 110 may receive various signals related to operational control, such as a clock signal CLK and a command signal CMD, as just two examples. High-speed interface section may receive addresses (RQ0 to RQ7) and may transfer data (DQB0 to DQB8) at the above-mentioned operating frequencies. High-speed interface section 110 may include a register for setting the operating frequency. The user may set a code in a register, which may indicate the desired operating frequency. In high speed interface section 110, the phase differences between input and output signals may be suitably compensated for the selected operating frequency set in the register. This may enable reliable operation in both a lower and higher frequency regions. Cores section 120 includes a plurality of banks BANK, which can have a protocol that may be compatible for data transfer via high-speed interface section 110. Core section 120 may have similar operational speed to a conventional DRAM.

In semiconductor device 100, writing in and reading out of data to and from core section 120 may be performed via high-speed interface circuit 110. The apparent operational speed may be increased by operating so as to interleave various banks BANK in core section 120. Accordingly, as seen from the outside, each bank BANK in core section 120 may be able to perform writing in and reading out of data at an operating frequency in the high frequency region without being hindered by a slow operational speed.

Figure 2:
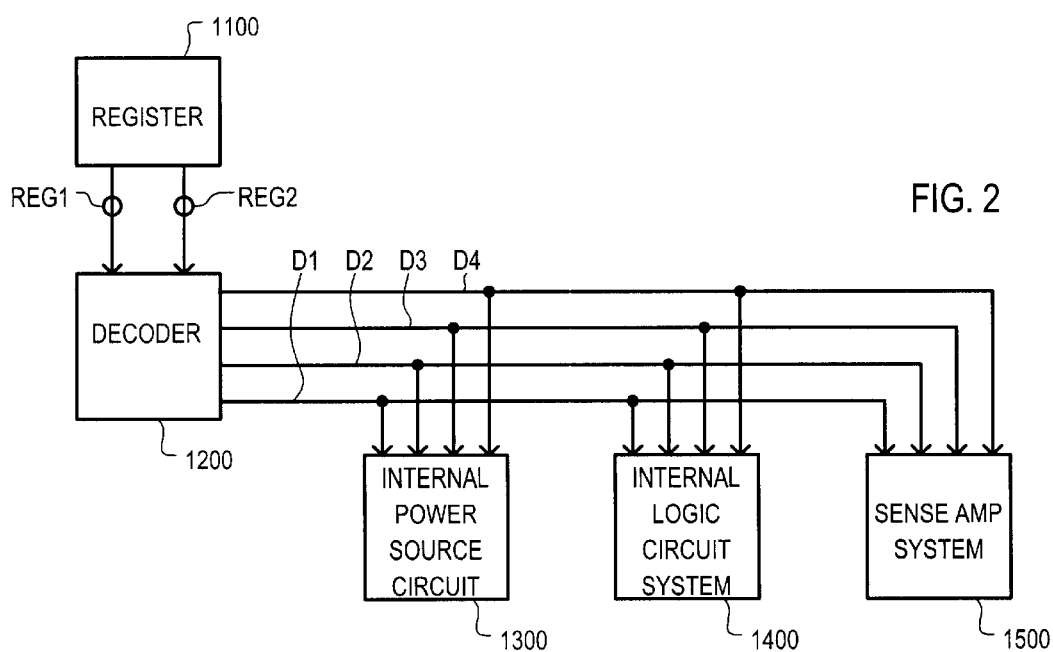
FIG. 2 is a block schematic diagram of a portion of a semiconductor device according to the first embodiment.

Referring now to FIG. 2, a block schematic diagram of a portion of semiconductor device 100 according to the first embodiment is set forth.

The portion of semiconductor device 100 of FIG. 2 may include a register 1100, a decoder 1200, an internal power source circuit 1300, an internal logic circuit system 1400, and a sense amp system 1500.

Register 1100 may be provided in the high-speed interface circuit 110 (FIG. 1). Decoder 1200 may receive signals (REG1 and REG2) from register 1100 and may provide decode signals (D1 to D4) to internal power source circuit 1300, internal logic circuit system 1400, and sense amp system 1500. In this way, changeover states of internal power source circuit 1300, internal logic circuit system 1400, and sense amp system 1500 may be controlled based upon a code set in register 1100 according to predetermined corresponding relationships. In this case, the predetermined corresponding relationships may be set in advance and may include a corresponding relationship between the operating frequency and the internal power supply voltage provided by internal power supply circuit 1300, a corresponding relationship between the operating frequency and the signal propagation delay in internal logic system circuit 1400, and a corresponding relationship between the operating frequency and the fixed current value supplied in sense amp system 1500. Each corresponding relationship may be set according to a selected operating frequency in order for the circuitry to operate in the most suitable manner.

Decoder 1200 may decode the code set in register 1100 and may generate decode signals (D1 to D4). In this example, two bit signals (REG1 and REG2) may be output from register 1100 as set codes. Four bit signals (D1 to D4) corresponding to the four possible combinations of logic values of signals (REG1 and REG2) may be output from decoder 1200. In this way, only one of signals (D1 to D4) may be high for any given combination of signals (REG1 and REG2).

Figure 3:
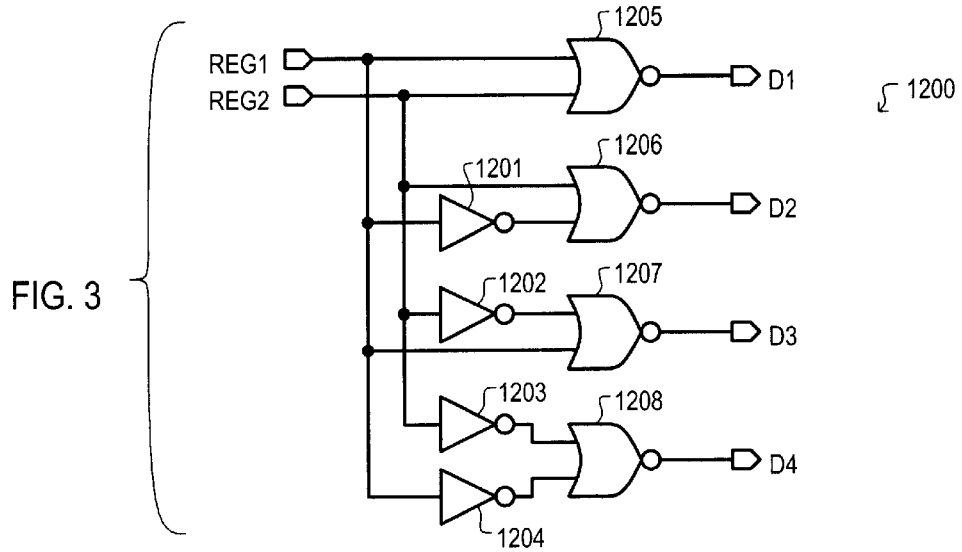
FIG. 3 is a circuit schematic diagram of a decoder according the first embodiment.

Referring now to FIG. 3, a circuit schematic diagram of decoder 1200 according the first embodiment is set forth.

Decoder 1200 may receive signals (REG1 and REG2) and may generated decoded signals (D1 to D4). Decoder 1200 may include inverters (1201 to 1204) and NOR gates (1205 to 1208).

NOR gate 1205 may receive signals (REG1 and REG2) as inputs and may generate decoded signal D1. NOR gate 1206 may receive signal REG2 at one input and signal REG1 inverted by inverter 1201 at another input and my generate decoded signal D2. NOR gate 1207 may receive signal REG1 at one input and signal REG2 inverted by inverter 1202 at another input and my generate decoded signal D3. NOR gate 1208 may receive signal REG2 inverted by inverter 1203 at one input and signal REG1 inverted by inverter 1204 at another input and my generate decoded signal D4.

One of decoded signals (D1 to D4) output by decoder 1200 may become high in response to the logical combination of signals (REG1 and REG2). If both signals (REG1 and REG2) are low, decoded signal D1 may be high. If signal REG1 is high and signal REG2 is low, then decoded signal D2 may be high. If signal REG1 is low and signal REG2 is high, then decoded signal D3 may be high. If signal REG1 is high and signal REG2 is high, then decoded signal D4 may be high.

In the first embodiment, if a code set in register 1100 (FIG. 2) denotes a low operating frequency (in this example 600 MHz), then both signals (REG1 and REG2) may be low and decoded signal D1 may be high. If a code set in register 1100 (FIG. 2) denotes a mid-level operating frequency (in this example 712 MHz), then signals REG1 may be high, signal REG2 may be low and decoded signal D2 may be high. If a code set in register 1100 (FIG. 2) denotes a high operating frequency (in this example 800 MHz), then signals REG1 may be low, signal REG2 may be high and decoded signal D3 may be high.

In addition to the above-mentioned combinations of signals (REG1 and REG2), both signals (REG1 and REG2) may be high. Thus, it may be possible to designate four operating frequencies. However, in the first embodiment only three operating frequencies (600 MHz, 712 MHz, and 800 MHz) may be designated and therefore setting the code in register 1100 so that signals (REG1 and REG2) are both high may be prohibited.

Referring once again to FIG. 2, internal power supply circuit 1300, internal logic circuit system 1400, and sense amp system 1500 will now be explained.

Internal power supply circuit 1300, internal logic circuit system 1400, and sense amp system 1500 may be elementary circuits of a DRAM and may be included in core section 120 (FIG. 1). Internal power supply circuit 1300 can be a circuit that may convert an externally supplied power supply voltage (for example 2.5 V) into an internal power supply voltage (for example 2.0 V) which may be appropriate for predetermined circuit devices such as transistors. Internal power supply circuit 1300 may include a function for supplying one of a plurality of voltages as an internal power supply voltage. Internal logic circuit system 1400 may be a circuit including a function of changing signal propagation delays. In this way, various signals may have timings set in advance. Circuits having signals affected may include an address input circuit, a pre-decoder circuit, a data input/output circuit, a data write circuit, or a control circuit for generating various control signals, as just a few examples. Sense amp system 1500 may be a circuit system for amplifying data signals indicative of data values stored in a row of memory cells connected to bit lines. Sense amp system 1500 may include a function of changing the current value of a fixed current source, which may be included in a differential type sense amplifier (amp).

Next, details of internal power supply circuit 1300, internal logic circuit system 1400, and sense amp system 1500 will be explained.

Figure 4:
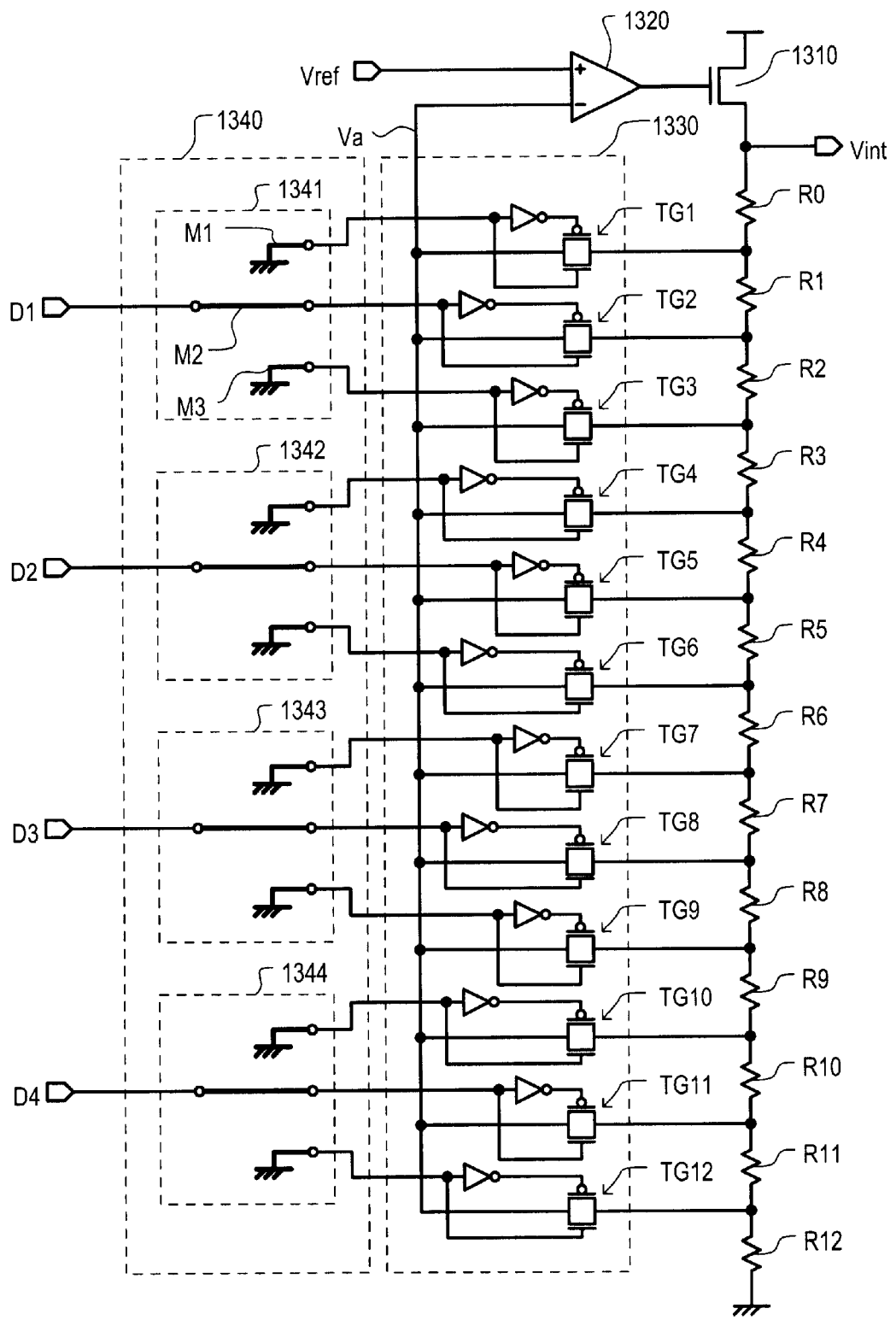
FIG. 4 is a circuit schematic diagram of internal power supply circuit according to the first embodiment.

Referring now to FIG. 4, a circuit schematic diagram of internal power supply circuit 1300 according to the first embodiment is set forth.

Internal power supply circuit 1300 may receive decoded signals. (D1 to D4) and reference voltage Vref as inputs and may provide an internal power supply Vint. Internal power supply circuit 1300 may include N-type insulated gate field effect transistor (IGFET) 1310, a differential amplifier 1320, a switch section 1340, a transfer gate section 1330, and resistors (R0 to R12).

N-type IGFET 1310 may have a drain connected to an power supply terminal, a source connected to resistor R0 at internal power supply Vint, and a gate connected to receive an output from differential amplifier 1320. N-type IGFET 1310 may be an N-type MOS (Metal-Oxide-Semiconductor) FET, as just one example. N-type IGFET may supply current to internal power supply Vint.

Resistors (R0 to R12) may be connected in series between the source of N-type IGFET 1310 (internal power supply node) and ground. At each connection node between adjacent resistors (R0 to R12) a voltage is supplied which is obtained by dividing the internal power supply voltage Vint in accordance with the resistance values.

Transfer gate section 1330 may be connected between connection nodes of adjacent resistors (R0 to R12) and the negative input of differential amplifier 1320. Transfer gate section 1330 may select between voltages provided by series connected resistors (R0 to R12). Transfer gate section 1330 may include transfer gates (TG1 to TG12). Each transfer gate (TG1 to TG12) may be connected between a connection node of adjacent resistors (R0 to R12) and the negative input of differential amplifier 1320. Each transfer gate (TG1 to TG12) may include a N-type IGFET, a P-type IGFET, and an inverter (none of which is denoted by any reference character to avoid unduly cluttering the figure). The input of the inverter in each transfer gate (TG1 to TG12) may be connected to the gate of the N-type IGFET. The output of the inverter in each transfer gate (TG1 to TG12) may be connected to the gate of the P-type IGFET. The input of the inverter in each transfer gate (TG1 to TG12) may also receive a control signal that controls whether the transfer gate is turned on or turned off. In this example, a particular transfer gate (TG1 to TG12) may be turned off when a low control signal is received and may be turned on when a high control signal is received. The control signals may be provided from switch section 1340. Transfer gates (TG1 to TG12) may be connected in common to the negative input of differential amplifier 1320 at node Va.

Switch section 1340 may receive decoded signals (D1 to D4) and may provide control signals to transfer gate section 1330. Switch section 1340 may include switches (1341 to 1344). Each switch (1341 to 1344) may have one input terminal and three output terminals. Each output terminal may be connected to supply a control signal to a respective transfer gate (TG1 to TG12) within transfer gate section 1330.

Each switch (1341 to 1344) may include an aluminum lead wire M2, which may selectively connect a decoded signal (D1 to D4) to a control terminal of a respective transfer gate (TG1 to TG12). Aluminum lead wires (M1 and M3) may electrically connect the two other outputs to ground. Aluminum lead wires (M1 to M3) may be programmable.

For example, in the case of switch 1341 illustrated in FIG. 4, control terminals to transfer gates (TG1 and TG3) may be connected to ground by aluminum lead wires (M1 and M3) while the control terminal to transfer gate TG2 may be connected to decoded signal D1. In this way, transfer gates (TG1 and TG3) may be disabled (turned off) and transfer gate TG2 may be controlled by decoded signal D1.

In a similar manner, for each of switches (1342 to 1344) one output signal may be controlled by decoded signal (D2 to D4), respectively, while the other two output signals may be grounded. For example, in switch section 1340 illustrated in FIG. 4, transfer gates (TG5, TG8, and TG11) may be controlled by decodes signals (D2, D3, and D4), respectively.

The connection state of switches (1341 to 1344) may be set by modifying aluminum lead wires (M1 to M3) for each switch (1341 to 1344) during the manufacturing process.

In the internal power supply circuit 1300 illustrated in FIG. 4, decoded signals (D1 to D4) may be supplied to control transfer gates (TG2, TG5, TG8, and TG11) through switch section 1340. The other transfer gates may be disabled (turned off). Accordingly, if decoded signal D1 is high (operating frequency is 600 MHz), only transfer gate TG2 may be enabled (turned on). Thus the voltage appearing at the connection node between resistors (R1 and R2) may be supplied to the negative input terminal of differential amplifier 1320.

In a similar manner, if decoded signal D2 is high (operating frequency is 712 MHz), only transfer gate TG5 may be enabled (turned on). Thus, the voltage appearing at the connection node between resistors (R4 and R5) may be supplied to the negative input terminal of differential amplifier 1320. Also, if decoded signal D3 is high (operating frequency is 800 MHz), only transfer gate TG8 may be enabled (turned on). Thus, the voltage appearing at the connection node between resistors (R7 and R8) may be supplied to the negative input terminal of differential amplifier 1320. The values of each resistor (R0 to R12) may be chosen so that the most suitable power supply voltage Vint may be obtained for each operating frequency.

In the example illustrated in FIG. 4, switch section 1340 is made by employing switches (1341 to 1344) having connection states determined by programming aluminum lead wires. Switches (1341 to 1344) may be constructed with other programmable structures or devices, for example, a programmable transistor or fuse, as just two examples.

Figure 5:
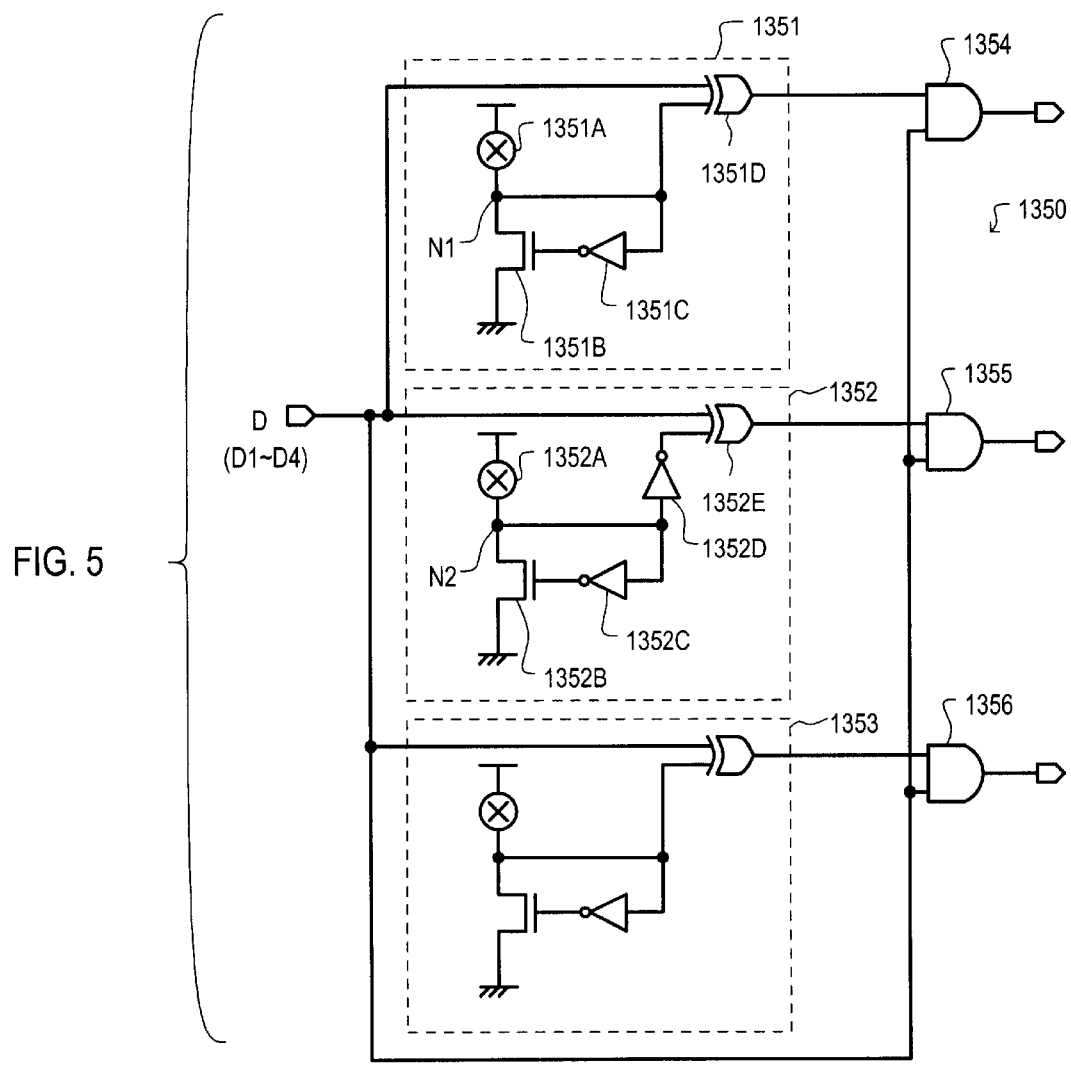
FIG. 5 is a circuit diagram of a switch according to one embodiment.

Referring now to FIG. 5, a circuit diagram of a switch according to one embodiment is set forth and given the general reference character 1350.

Switch 1350 may be programmable with fuses. Switch 1350 may be used for switches (1341 to 1344) in the switch section 1340 illustrated in FIG. 4.

Switch 1350 may receive one of decoded signals (D1 to D4) and may generate three control signals to control three of transfer gates (TG1 to TG12). Switch 1350 may include fuse circuits (1351 to 1353) and AND gates (1354 to 1356). Fuse circuit 1351 may receive one of decoded signals (D1 to D4) as an input and may provide an output to an input of AND gate 1354. Fuse circuit 1352 may receive one of decoded signals (D1 to D4) as an input and may provide an output to an input of AND gate 1355. Fuse circuit 1353 may receive one of decoded signals (D1 to D4) as an input and may provide an output to an input of AND gate 1356. AND gates (1354 to 1356) may each receive the one of decoded signals (D1 to D4) at an input and may provide control signals to three of transfer gates (TG1 to TG12).

Fuse circuit 1351 may include a fuse 1351A, a N-type IGFET 1351B, an inverter 1351C and an exclusive OR gate 1351D. Fuse 1351A may be connected between a power supply and node N1. N-type IGFET 1351B may have a source connected to ground, a drain connected to node N1, and a gate connected to the output of inverter 1351C. Inverter 1351C may have an input connected to node N1. Exclusive OR 1351D may have one input connected to node N1, another input connected to the one of decoded signals (D1 to D4), and an output connected to an input of AND gate 1354.

If fuse 1351A is intact (not broken), node N1 may be high. Inverter 1351C may apply a low to the gate of N-type IGFET 1351B. Thus N-type IGFET 1351B may be turned off. As a result, node N1 may constantly apply a high voltage (logic) level to an input of exclusive OR 1351D.

If fuse 1351A is not intact (broken), node N1 may be pulled low by N-type IGFET 1351B. Inverter 1351C may apply a high to the gate of N-type IGFET 1351B. Thus N-type IGFET 1351B may remain on. As a result, node N1 may constantly apply a low voltage (logic) level to an input of exclusive OR 1351D.

Accordingly, fuse circuit 1351 may function as an inverter for the one of four decoded signals (D1 to D4) if fuse 1351A is intact. However if fuse 1351A is broken, fuse circuit 1351 may function as a buffer for the one of four decoded signals (D1 to D4).

Fuse circuit 1352 may include include a fuse 1352A, a N-type IGFET 1352B, inverters (1352C and 1352D), and an exclusive OR gate 1352E. Fuse 1352A may be connected between a power supply and node N2. N-type IGFET 1352B may have a source connected to ground, a drain connected to node N2, and a gate connected to the output of inverter 1352C. Inverter 1352C may have an input connected to node N2. Inverter 1352D may have an input connected to node N2 and an output connected to an input of exclusive OR 1352E. Exclusive OR 1352E may have another input connected to the one of decoded signals (D1 to D4), and an output connected to an input of AND gate 1355.

If fuse 1352A is intact (not broken), node N2 may be high. Inverter 1352C may apply a low to the gate of N-type IGFET 1352B. Thus, N-type IGFET 1352B may be turned off. As a result, node N2 may constantly apply a high voltage (logic) level to an input of inverter 1352D and inverter 1352D may apply a constant low voltage (logic) level to an input of exclusive OR gate 1352E.

If fuse 1352A is not intact (broken), node N2 may be pulled low by N-type IGFET 1352B. Inverter 1352C may apply a high to the gate of N-type IGFET 1352B. Thus N-type IGFET 1352B may remain on. As a result, node N2 may constantly apply a low voltage (logic) level to an input of inverter 1352D and inverter 1352D may apply a constant high voltage (logic) level to an input of exclusive OR gate 1352E.

Accordingly, fuse circuit 1352 may function as a buffer for the one of four decoded signals (D1 to D4) if fuse 1352A is intact. However if fuse 1352A is broken, fuse circuit 1352 may function as an inverter for the one of four decoded signals (D1 to D4).

Fuse circuit 1353 may be constructed and operate in a similar manner as fuse circuit 1351, thus the description has been omitted.

AND gates (1354 to 1356) may receive output signals, respectively, from fuse circuits (1351 to 1353) at one input and may receive the one of four decoded signals (D1 to D4) at another input. In this way, an output signal from switch 1350 may only become high, if the one of four decoded signals (D1 to D4) is also high.

The operation of switch 1350 will now be explained.

In the explanation, the one of four decoded signals (D1 to D4) may be referred to as decoded signal D.

If decoded signal D, which may be output from decoder 1200 (FIG. 2), is high AND gates (1354 to 1356) may, respectively, generate output signals that have the same logic value as the outputs of fuse circuits (1351 to 1353). In other words, if decoded signal D is high, then switch 1350 may be enabled and the output signals of fuse circuits (1351 to 1353) may pass through AND gates (1354 to 1356). However, if decoded signal D is low, then AND gates (1354 to 1356) may each output a low logic value regardless of the logic levels of the output signals of fuse circuits (1351 to 1353). In this case, switch 1350 may be considered to be in a disabled state.

Switch 1350 may be programmed by blowing or leaving intact fuses. When fuses 1351A in fuse circuits (1351 and 1353) are intact, then fuse circuits (1351 and 1353) may be disabled. However, when fuse 1352A in fuse circuit 1352 is intact, then fuse circuit 1352 may be enabled. Thus, the default condition when no fuse (1351A and 1352A) is blown, is that fuse circuit 1352 may be enabled and the output of AND gate 1355 may be activated (high) when decoded signal D is high. When either fuse 1351A within fuse circuit (1351 or 1353) is blown, then the respective fuse circuit (1351 or 1353) may be enabled and the output of the respective AND gate (1354 or 1356) may be activated when decoded signal D is high. In this case, fuse 1352A within fuse circuit 1352 may be blown.

Referring now to FIG. 4 in conjunction with FIG. 5, the operation of internal power source circuit 1300 when switches (1341 to 1344) of FIG. 4 are each replaced with switch 1350 of FIG. 5 will now be described.

Because three of the four decoded signals (D1 to D4) are low, three of the four switches (1341 to 1344, each replaced with switch 1350) may have outputs from AND gates (1354 to 1356) that are all low. In the switch (1341 to 1344) that receives a decoded signal (D1 to D4) that is high, the output of AND gates (1354 to 1356) depends on the state of fuses (1351A and 1352A) in fuse circuits (1351 to 1353).

The operation of the switch (1341 to 1344, replaced with switch 1350) that receives the decoded signal (D1 to D4) that is high will now be explained. If none of the fuses (1351A and 1352A) in fuse circuits (1351 to 1353) are broken, then fuse circuits (1351 and 1353) may act as inverters and may invert the decoded signal D. Thus, AND gates (1354 and 1356) may receive a low input from fuse circuits (1351 and 1353) and may provide low outputs to disable their respective transfer gates (TG1 to TG12) in transfer gate section 1330. However, fuse circuit 1352 may act as a buffer for decoded signal D. Thus, AND gate 1355 may receive a high input from fuse circuit 1352 and may provide a high output to enable the respective transfer gate (TG1 to TG12) in transfer gate section 1330. In this way, a connection node between respective resistors (R0 to R12) may be electrically connected to node Va.

By selectively programming fuse circuits (1351 to 1353) and selecting an operating frequency, any of the connection nodes between respective resistors (R0 to R12) may be electrically connected to node Va. In a quiescent state, the voltage at node Va may be forced to be the same as the voltage of reference potential. In this way, internal voltage Vint may be set at a predetermined voltage to achieve such a result.

By using fuses, instead of metal options such as aluminum lead wires (M1 to M3), the voltage of internal voltage Vint for different operating frequencies may be selected by trimming the fuses after manufacturing. In this way, characterization tests on each lot may be executed, so that the effects of processing variations may be minimized.

Next, internal logic circuit system 1400 illustrated in FIG. 2 will be explained with reference to FIGS. 6 and 7. The example for internal logic circuit system 1400 is a structure related to a circuit system for reading out a data signal from a memory cell in a memory cell array.

Figure 6:
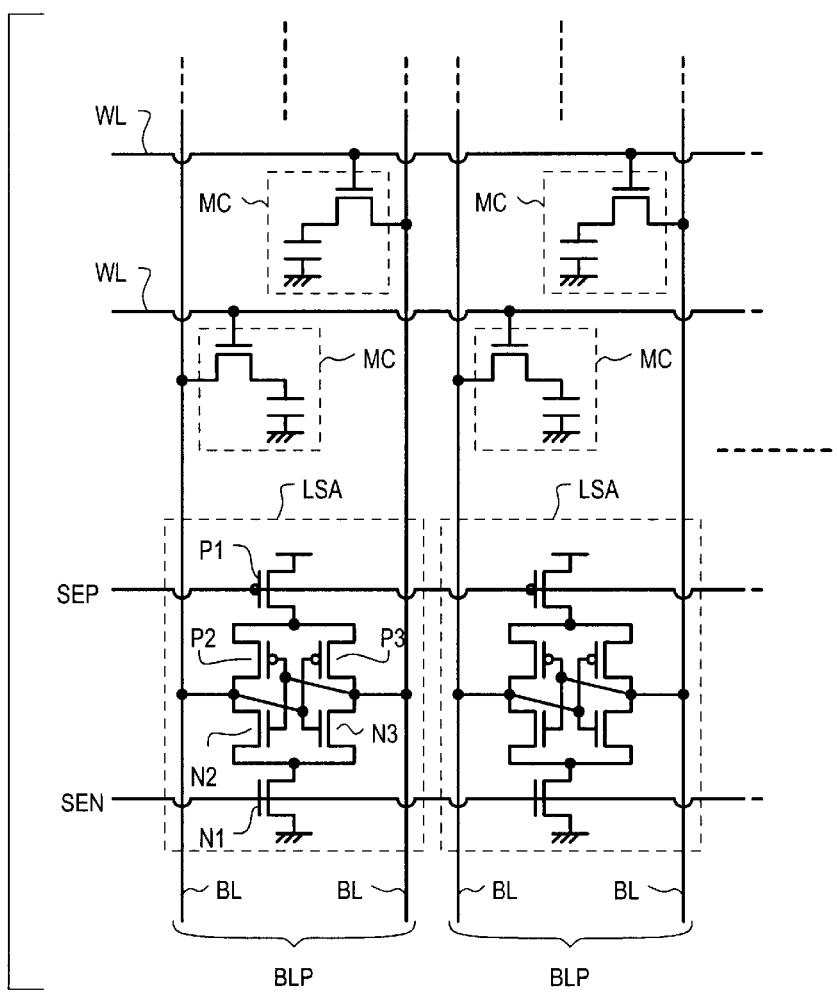
FIG. 6 is a circuit diagram illustrating sense amplifiers and memory cells in a DRAM array.

FIG. 6 is a circuit diagram illustrating sense amplifiers and memory cells in a DRAM array. FIG. 7 is a circuit diagram illustrating the generation of sense amplifier enable signals.

Referring now to FIG. 6, in the memory cell array (not given a general reference character), a plurality of bit lines BL may be arranged so as to be perpendicular to a plurality of word lines WL. A memory cell MC may be formed in a matrix at intersections of bit lines BL and word lines WL. Two bit lines BL may make up a bit line pair BLP. A particular word line WL may only be connected to one memory cell MC per bit line pair BLP.

A latch type sense amp LSA may be connected to each bit line pair BLP. Each latch type sense amp LSA may include a flip-flop made up of P-type IGFETS (P2 and P3) and N-type IGFETs (N2 and N3). Each latch type sense amp LSA may also include a P-type IGFET P1 and N-type IGFET N1 for respectively supplying driving voltages to the flip-flop. In this case, the driving voltages may be a power supply voltage and ground, respectively. P-type IGFET P1 and N-type IGFET N1 may be controlled by sense amp activation signals (SEP and SEN), respectively.

When sense amp activation signals (SEP and SEN) become low and high, respectively, P-type IGFET P1 and N-type IGFET N1 are turned on and the latch type sense amp LSA is activated. When the latch type sense amp LSA is activated, the flip-flop (IGFETs P2, P3, N2, and N3) may enter one of two stable states depending on the potentials on the bit lines BL in the bit line pair BLP connected to the latch type sense amp LSA. A potential difference between bit lines BL in the bit line pair BLP may be provided in accordance with a data value stored in a selected memory cell MC connected to the bit line pair BLP. The potential difference may be provided before sense amp activation signals (SEP and SEN) become low and high, respectively. When sense amp activation signals (SEP and SEN) become low and high, respectively, the potential difference between bit lines BL in the bit line pair BLP may be amplified and the flip-flop may enter the respective stable state.

Although the data signal that has been amplified by the latch type sense amp LSA may be read out from the memory cell array via a column switch (not shown), the amplified data signal may be written back into the memory cell MC. In this way, data integrity may be maintained. However, if an erroneously read data value is written back into the memory cell MC, data integrity is destroyed. For this reason, the timing of sense amp activation signals (SEP and SEN) may be critical. It is necessary that a bit line BL has received a sufficient signal from a selected memory cell MC before sense amp activation signals (SEP and SEN) become low and high, respectively. However, for access speeds it may be necessary for sense amp activation signals (SEP and SEN) become low and high, respectively, as soon as possible.

Figure 7:
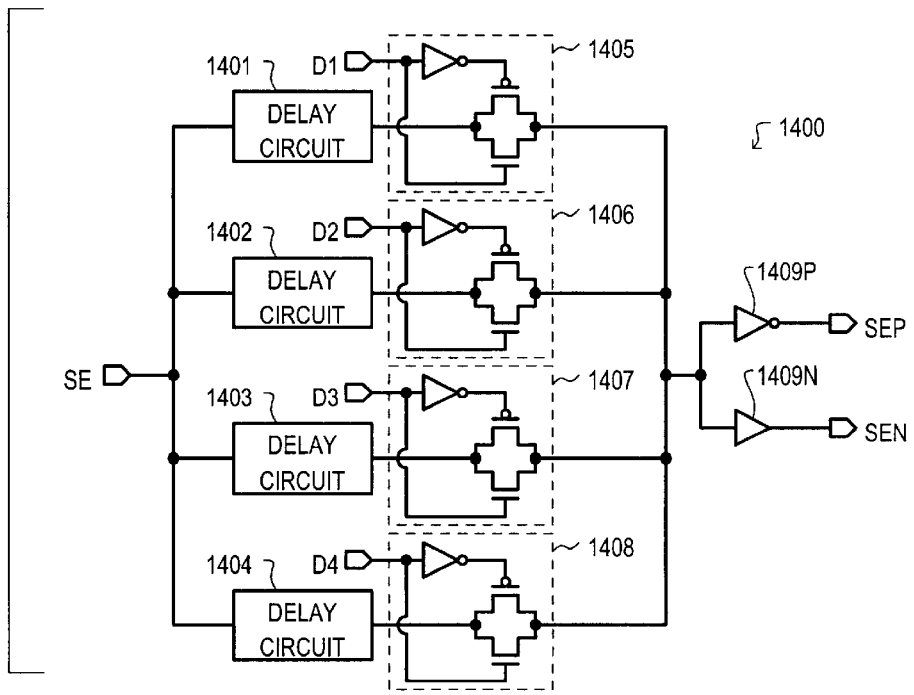
FIG. 7 is a circuit diagram illustrating the generation of sense amplifier enable signals according to an embodiment.

Referring now to FIG. 7, a circuit schematic diagram for internal logic system 1400 according to an embodiment is set forth.

Internal logic system 1400 may receive a control signal SE and may generate sense amp activation signals (SEP and SEN). Internal logic system 1400 may include delay circuits (1401 to 1404), transfer gates (1405 to 1408), an inverter 1409P, and a buffer 1409N. Control signal SE may be a global sense amplifier enable signal, as just one example.

Delay circuit 1401 may receive control signal SE at an input and may provide an output to transfer gate 1405. Transfer gate 1405 may receive decoded signal D1 and may provide an output to inverter 1409P and buffer 1409N. Delay circuit 1402 may receive control signal SE at an input and may provide an output to transfer gate 1406. Transfer gate 1406 may receive decoded signal D2 and may provide an output to inverter 1409P and buffer 1409N. Delay circuit 1403 may receive control signal SE at an input and may provide an output to transfer gate 1407. Transfer gate 1407 may receive decoded signal D3 and may provide an output to inverter 1409P and buffer 1409N. Delay circuit 1404 may receive control signal SE at an input and may provide an output to transfer gate 1408. Transfer gate 1408 may receive decoded signal D4 and may provide an output to inverter 1409P and buffer 1409N. Each transfer gate (1405 to 1408) may include an inverter, N-type IGFET, and Ptype IGFET (not designated by any reference characters). The inverter may receive a decoded signal (D1 to D4) and may provide an output to a control gate of the P-type IGFET. The N-type IGFET may receive a decoded signal (D1 to D4) at a control gate. The P-type IGFET and N-type IGFET may have source-drain paths connected in parallel between the output of a respective delay circuit (1401 to 1404) and inputs to inverter 1409P and buffer 1409N. In this way, transfer gates (1405 to 1408) may have outputs commonly connected. A transfer gate (1405 to 1408) may be turned on when the respective decoded signal (D1 to D4) received is high and may be turned off when the respective decoded signal (D1 to D4) received is low. When turned on, a transfer gate (1405 to 1408) may provide a low impedance path between the output of the respective delay circuit (1401 to 1404) and the inputs to inverter 1409P and buffer 1409N.

In this way, when decoded signal D1 is high, control signal SE is delayed by the propagation delay of delay circuit 1401 to generate sense amp activation signals (SEP and SEN). When decoded signal D2 is high, control signal SE is delayed by the propagation delay of delay circuit 1402 to generate sense amp activation signals (SEP and SEN). When decoded signal D3 is high, control signal SE is delayed by the propagation delay of delay circuit 1403 to generate sense amp activation signals (SEP and SEN). When decoded signal D4 is high, control signal SE is delayed by the propagation delay of delay circuit 1404 to generate sense amp activation signals (SEP and SEN).

Propagation delays of delay circuits (1401 to 1404) may be respectively selected in advance so that the sense amp activation signals (SEP and SEN) can have suitable timings for the selected operating frequency (for example, 600 MHz, 712 MHz, and 800 MHz).

Next sense amp system 1500 illustrated in FIG. 2 will be explained.

Figure 8:
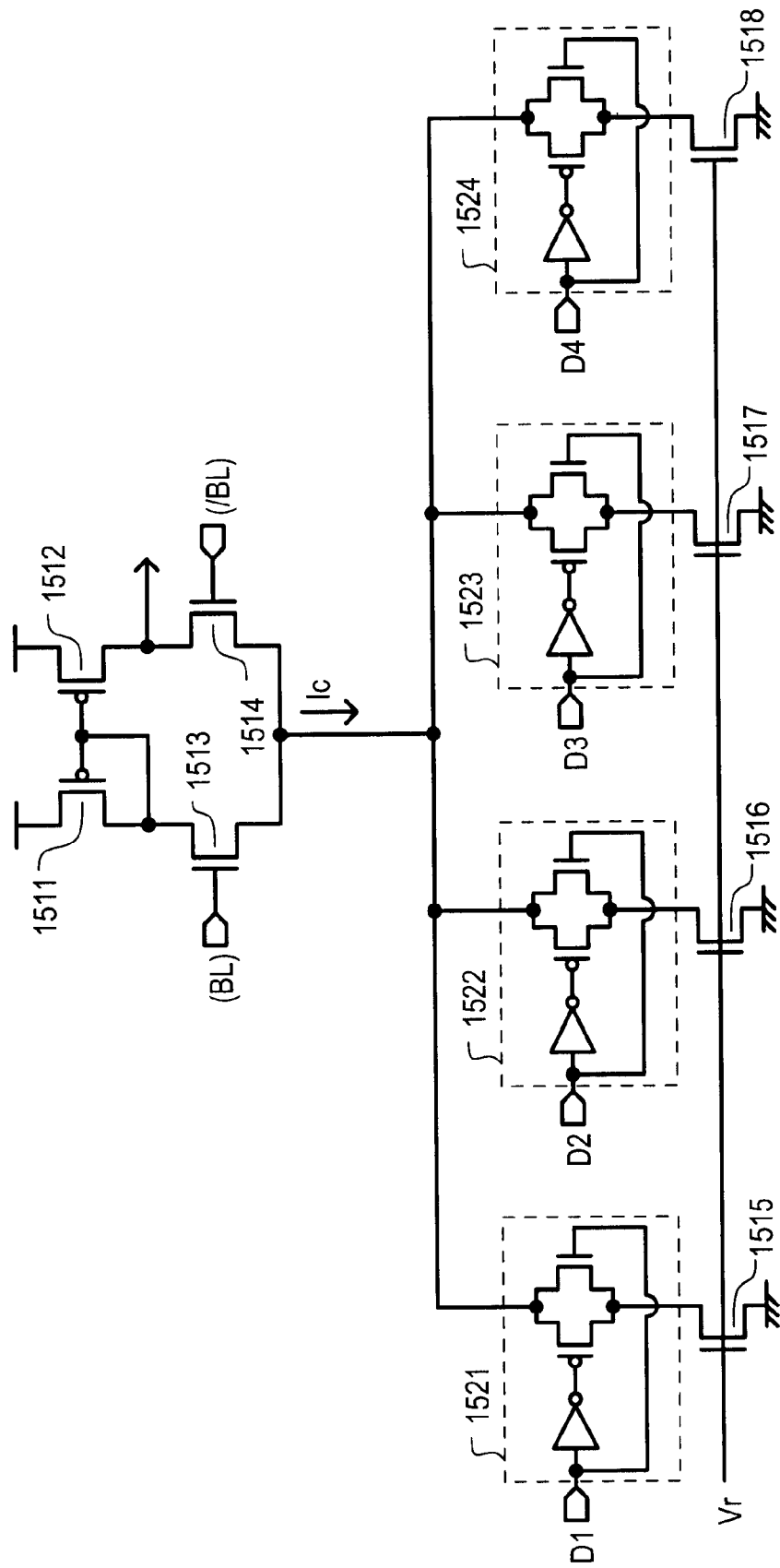
FIG. 8 is a circuit schematic diagram of a portion of a sense amp system according to an embodiment.

Referring now to FIG. 8, a portion of sense amp system 1500 is set forth in a circuit schematic diagram.

The circuit schematic diagram in FIG. 8 illustrates a differential type sense amp (data amp), which may be provided at a latter stage in a data output path other than the latch type sense amp LSA. The portion of sense amp system 1500 may receive a pair of bit lines (BL and /BL), decoded signals (D1 to D4), and a reference voltage Vr as inputs and may generate an output that may indicate a data value input from the pair of bit lines (BL and /BL). Pair of bit lines (BL and /BL) may provide complementary data signals. The portion of sense amp system 1500 may include P-type IGFETs (1511 and 1512), N-type IGFETs (1513 and 1514), N-type IGFETs (1515 to 1518), and transfer gates (1521 to 1524).

P-type IGFET 1511 may have a source connected to a power supply and a control gate and drain connected to a control gate of P-type IGFET 1512 and a drain of N-type IGFET 1513. P-type IGFET 1512 may have a source connected to a power supply and a drain connected to the drain of N-type IGFET 1514 at an output node. N-type IGFET 1513 may have a source connected to a common output of transfer gates (1521 to 1524) and a control gate connected to bit line BL. N-type IGFET 1514 may have a source connected to a common output of transfer gates (1521 to 1524) and a control gate connected to bit line /BL. Collectively, P-type IGFETs (1511 and 1512) and N-type IGFETs (1513 and 1514) may comprise a differential type sense amp.

N-type IGFET 1515 may have a source connected to ground, a drain connected to an input of transfer gate 1521 and a control gate connected to a reference voltage Vr. N-type IGFET 1516 may have a source connected to ground, a drain connected to an input of transfer gate 1522 and a control gate connected to a reference voltage Vr. N-type IGFET 1517 may have a source connected to ground, a drain connected to an input of transfer gate 1523 and a control gate connected to a reference voltage Vr. N-type IGFET 1518 may have a source connected to ground, a drain connected to an input of transfer gate 1524 and a control gate connected to a reference voltage Vr. Reference voltage Vr may be selected so that N-type IGFETs (1515 to 1518) may operate in the saturation region. N-type IGFETs (1515 to 1518) may have control gate sizes (width and length) set to obtain suitable current values for operating frequencies that may be selected. For example, N-type IGFET 1515 may provide a suitable current to allow appropriate data sensing for a semiconductor device 100 having a 600 MHz operating frequency. N-type IGFET 1516 may provide a suitable current to allow appropriate data sensing for a semiconductor device 100 having a 712 MHz operating frequency. N-type IGFET 1517 may provide a suitable current to allow appropriate data sensing for a semiconductor device 100 having a 800 MHz operating frequency.

Transfer gate 1521 may receive decoded signal D1 as an input and may provide a controllable impedance path between a drain of N-type IGFET 1515 and commonly connected sources of N-type IGFETs (1513 and 1514). Transfer gate 1522 may receive decoded signal D2 as an input and may provide a controllable impedance path between a drain of N-type IGFET 1516 and commonly connected sources of N-type IGFETs (1513 and 1514). Transfer gate 1523 may receive decoded signal D3 as an input and may provide a controllable impedance path between a drain of N-type IGFET 1517 and commonly connected sources of N-type IGFETs (1513 and 1514). Transfer gate 1524 may receive decoded signal D4 as an input and may provide a controllable impedance path between a drain of N-type IGFET 1518 and commonly connected sources of N-type IGFETs (1513 and 1514). Each transfer gate (1521 to 1524) may include an inverter, a P-type IGFET, and a N-type IGFET (not designated by a reference character). The N-type IGFET and P-type IGFET may have source/drain paths commonly connected between a drain of a N-type IGFET (1515 to 1518) and commonly connected sources of N-type IGFETs (1513 and 1514). The N-type IGFET may have a control gate connected to a decoded signal (D1 to D4). The inverter may receive a decoded signal (D1 to D4) as an input and may provide an output to a control gate of the P-type IGFET. A transfer gate (1521 to 1524) may provide a low impedance path (enabled) when its respective decoded signal (D1 to D4) is high. A transfer gate (1521 to 1524) may provide a high impedance path (disabled) when its respective decoded signal (D1 to D4) is low.

Only one of the four decoded signals (D1 to D4) output from decoder 1200 may be high at any time in accordance with a selected operating frequency. In this way, N-type IGFETs (1515 to 1518) may provide a particular current to the differential type sense amp in accordance with the selected operating frequency. In the first embodiment, decoded signal D4 may always be low. Thus, transfer gate 1524 may be in the disabled state. However, if a fourth operating frequency is desired, then decoded signal D4 and transfer gate 1524 may be used.

Instead of having N-type IGFETs (1515 to 1518) each providing a particular current, one IGFET may have a control gate selectively connected to a plurality of reference potentials to provide a plurality of particular currents, as just one example.

The operation of the first embodiment will now be explained with regard to selecting the internal power supply voltage by internal power supply circuit 1300, selecting the delay value in internal logic circuit system 1400, and selecting the current value in sense amp system 1500 in accordance with a selected operating frequency.

The user of semiconductor device 100 may provide to register 1100 a code indicative of the desired operating frequency. This may be performed under the control of an external CPU, as just one example. Register 1100 may output signals (REG1 and REG2) indicative of the set code. In the following explanation it will be assumed that signals (REG1 and REG2) are low.

Decoder 1200 may decode signals (REG1 and REG2) and may output decoded signals (D1 to D4). Referring now to FIG. 3, if signals (REG1 and REG2) are low, then the output of NOR gate 1205 may be high and the output of NOR gates (1206 to 1208) may be low. Thus, decoded signal D1 may be high and decoded signals (D2 to D4) may all be low. Decoded signal (D1 to D4) may be commonly provided to internal power supply circuit 1300, internal logic circuit system 1400, and sense amp system 1500.

Referring now internal power source circuit 1300 illustrated in FIG. 4, decoded signal D1 may be provided to a control terminal of transfer gate TG2 through switch 1341. Thus, transfer gate TG2 may be enabled and may electrically connect a connection node between resistors (R1 and R2) as voltage Va to a negative input of differential amplifier 1320. Differential amplifier may provide a control signal to the gate of N-type IGFET 1310, so that current may be provided to series connected resistors (R0 to R12) in order for voltage Va to be approximately equal to reference voltage Vref. Internal power supply voltage Vint may be set accordingly. In this way, the value of internal power supply voltage Vint may be selected in accordance with a desired operating frequency. It is noted, in the first embodiment, that the value of internal power supply voltage Vint may increase as the desired operating frequency increases.

Referring now to internal logic system 1400 illustrated in FIG. 7, when decoded signal D1 goes high, transfer gate 1405 may become enabled. Thus, control signal SE may be delayed by the propagation delay of delay circuit 1401 to generate sense amp activation signals (SEP and SEN). In this way, sense amp activation signals (SEP and SEN) may have timings set in accordance with the desired operating frequency.

Referring now the portion of sense amp system 1500 illustrated in FIG. 8, when decoded signal D1 goes high, transfer gate 1521 may become enabled. Thus, the value of current Ic provided to the differential type sense amp may be determined by N-type IGFET 1515. In this way, current Ic may have a value set in accordance with the desired operating frequency.

The significance of adjusting the timing of sense amp activation signal will be illustrated with reference to FIG. 9.

Referring now to FIG. 9, a timing diagram illustrating sensing according to an embodiment is set forth.

Figure 9A:
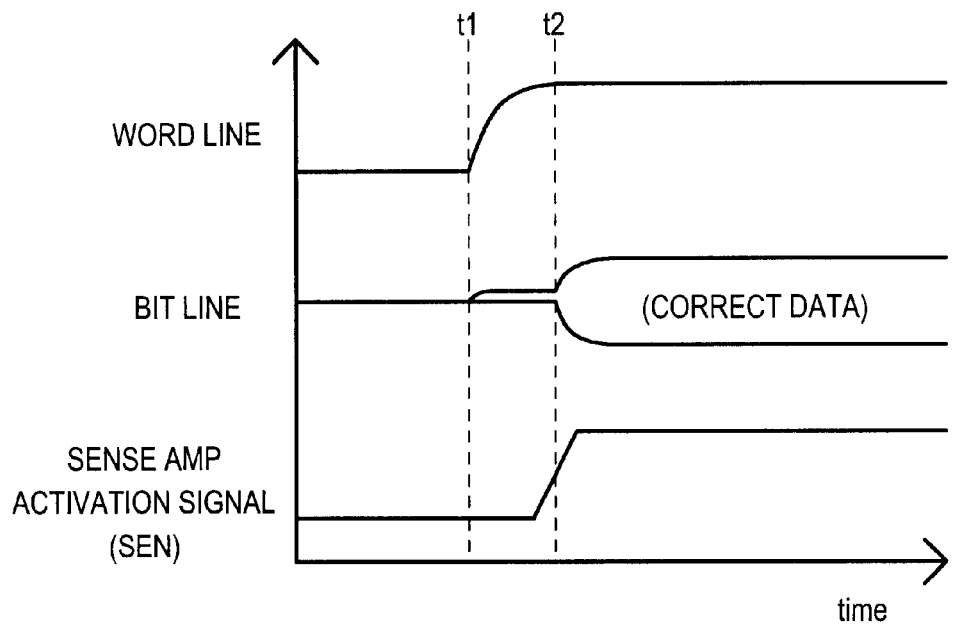
FIG. 9A is a timing diagram illustrating timing when an internal power supply voltage and timing of sense amp activation signals are modified in accordance with a change in a frequency of operation according to one embodiment.

FIG. 9A illustrates timing when internal power supply voltage Vint and timing of sense amp activation signals (SEP and SEN) are modified in accordance with a change in a frequency of operation.

Figure 9B:
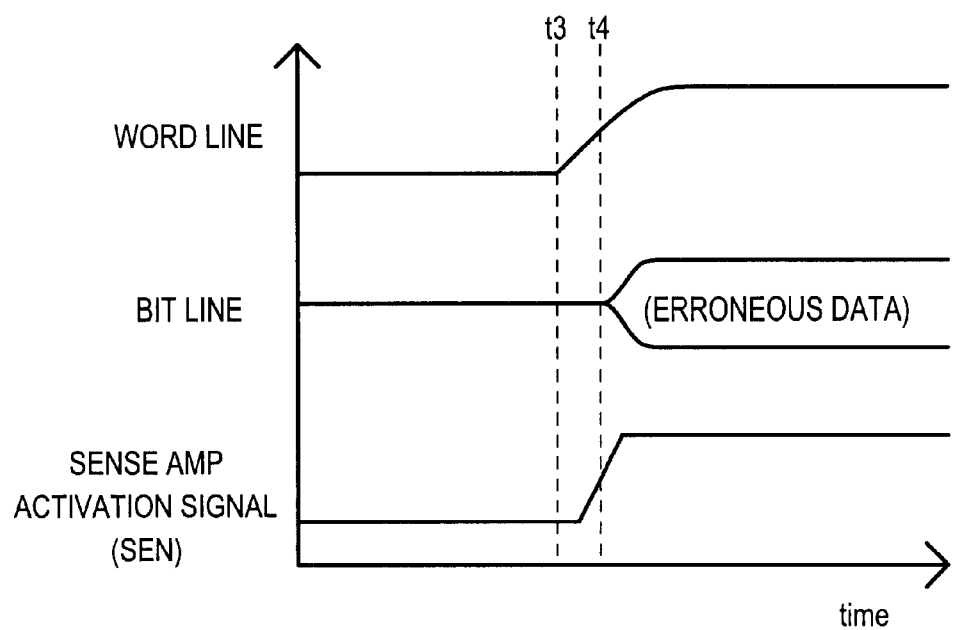
FIG. 9B is a timing diagram illustrating timing when an internal power supply voltage and timing of sense amp activation signals are not modified.

FIG. 9B illustrates timing when internal power supply voltage Vint is modified and timing of sense amp activation signals (SEP and SEN) is not modified.

FIG. 9A includes a word line signal WORD LINE, a bit line pair BIT LINE, and a sense amp activation signal SEN. It is noted that only sense amp activation signal SEN is illustrated. Sense amp activation signal SEP may have a waveform that is complementary to sense amp activation signal SEN.

The voltage of internal power supply Vint may be set by internal power source circuit 1300 to an appropriate potential based on the operating frequency (for example 2.0 V). At time t1, word line may rise. A bit line from the bit line pair may receive a data signal from a selected memory cell. Thus, an electrical potential difference between the bit line pair may develop. At time t2, sense amp activation signals (SEP and SEN) may enable the latch type sense amp LSA to sense the potential difference on the bit line pair and latch correct data. The timing of sense amp activation signals (SEP and SEN) may be set by internal logic circuit system 1400. In this way, correct data may be read out by adjusting a power supply potential and internal timings in accordance with a desired operating frequency.

FIG. 9B includes a word line signal WORD LINE, a bit line pair BIT LINE, and a sense amp activation signal SEN. It is noted that only sense amp activation signal SEN is illustrated. Sense amp activation signal SEP may have a waveform that is complementary to sense amp activation signal SEN.

The voltage of internal power supply Vint may be to a low value, thus delaying the generation of the word line. At time t3, word line may rise. A bit line from the bit line pair may receive a data signal from a selected memory cell. Thus, an electrical potential difference between the bit line pair may develop. At time t4, sense amp activation signals (SEP and SEN) may enable the latch type sense amp LSA to sense the potential difference on the bit line pair and latch data. However, in this case, the timing of sense amp activation signals (SEP and SEN) are not modified to compensate for a change in the internal power supply Vint. Changes in the voltage of internal power supply Vint may create timing mismatches between critical signals, such as word line generation and sense amp timing, as just two examples. If the mismatch is too great, erroneous data may be read out.

Thus, it can be seen that by adjusting the timing of sense amp activation signals (SEP and SEN), with respect to control signal SE in internal logic circuit system 1400 along with the change in internal power supply Vint, mismatches between signals may be avoided. This may provide sufficient margin for reliable operation of semiconductor device 100 over different operating conditions.

In the first embodiment, the value of the internal power supply voltage Vint may be modified in accordance with a desired operating frequency. In the internal power source circuit 1300 illustrated in FIG. 4, the value of the internal supply voltage Vint supplied for a desired operating frequency may be modified by changing a pattern of aluminum lead wires. In this way, the connection state of switch section 1340 may be changed by modifying a mask used for patterning the aluminum lead wire layer. Thus, changing the connections of the aluminum lead wires. By doing so, the transfer gates (TG1 to TG12) which are controlled by decoded signal (D1 to D4) may be changed. Thus, the voltage Va supplied to differential amplifier 1320 may be changed and the value of internal supply voltage Vint may be adjusted to a suitable value. In accordance, the delay amount provided by internal logic circuit system 1400 and the current value provided by sense amp system 1500 may be adjusted in a similar manner.

If a switch 1350, as illustrated in FIG. 5, is used for switches (1340 to 1344) in internal power source circuit 1300 illustrated in FIG. 4, then the transfer gate (TG1 to TG12) of transfer gate section 1330 controlled by decoded signal (D1 to D4) may be changed in a similar manner by programming fuses in fuse circuit (1351 to 1353).

As described above, internal power supply voltage Vint provided by internal power supply circuit 1300, the delay amount provided by internal logic circuit system 1400, and the current value provided by sense amp system 1500 may be set based upon a code which has been set in register 1100 in accordance to a desired operating frequency.

Accordingly, if the code in register 1100 is changed indicating a different desired operating frequency, the decoded signal (D1 to D4) having a high level output from decoder 1200 may change. Thus, the value of internal power supply voltage Vint by internal power supply circuit 1300, the delay amount provided by internal logic circuit system 1400, and the current value provided by sense amp system 1500 may be changed according to the changed code.

According to the first embodiment, the values of resistors (R0 to R12), delay amounts of delay circuits (1401 to 1404), and current capacities of N-type IGFETs (1515 to 1518) may be set in the circuit design stage in order to obtain suitable values for the internal power supply voltage Vint, the timing of sense amp activation signals (SEP and SEN), and current values in sense amp system 1500, by setting a code value in accordance with the desired operating frequency. In this way, excess current consumption may be reduced.

A second embodiment will now be explained.

In the first embodiment described above, decoded signals (D1 to D4) commonly input to internal power supply circuit 1300, internal logic circuit system 1400, and sense amp system 1500 and the values of the internal power supply voltage. Vint, the timing of sense amp activation signals (SEP and SEN), and the current supplied to the differential type sense amp may be modified in four ways. However, it may not be necessary to have four modifications for each of power supply circuit 1300, internal logic circuit system 1400, and sense amp system 1500. The semiconductor device according to the second embodiment may be made so as to enable the number of modifications for each of power supply circuit 1300, internal logic circuit system 1400, and sense amp system 1500 to be individually set to its own appropriate value.

Figure 10:
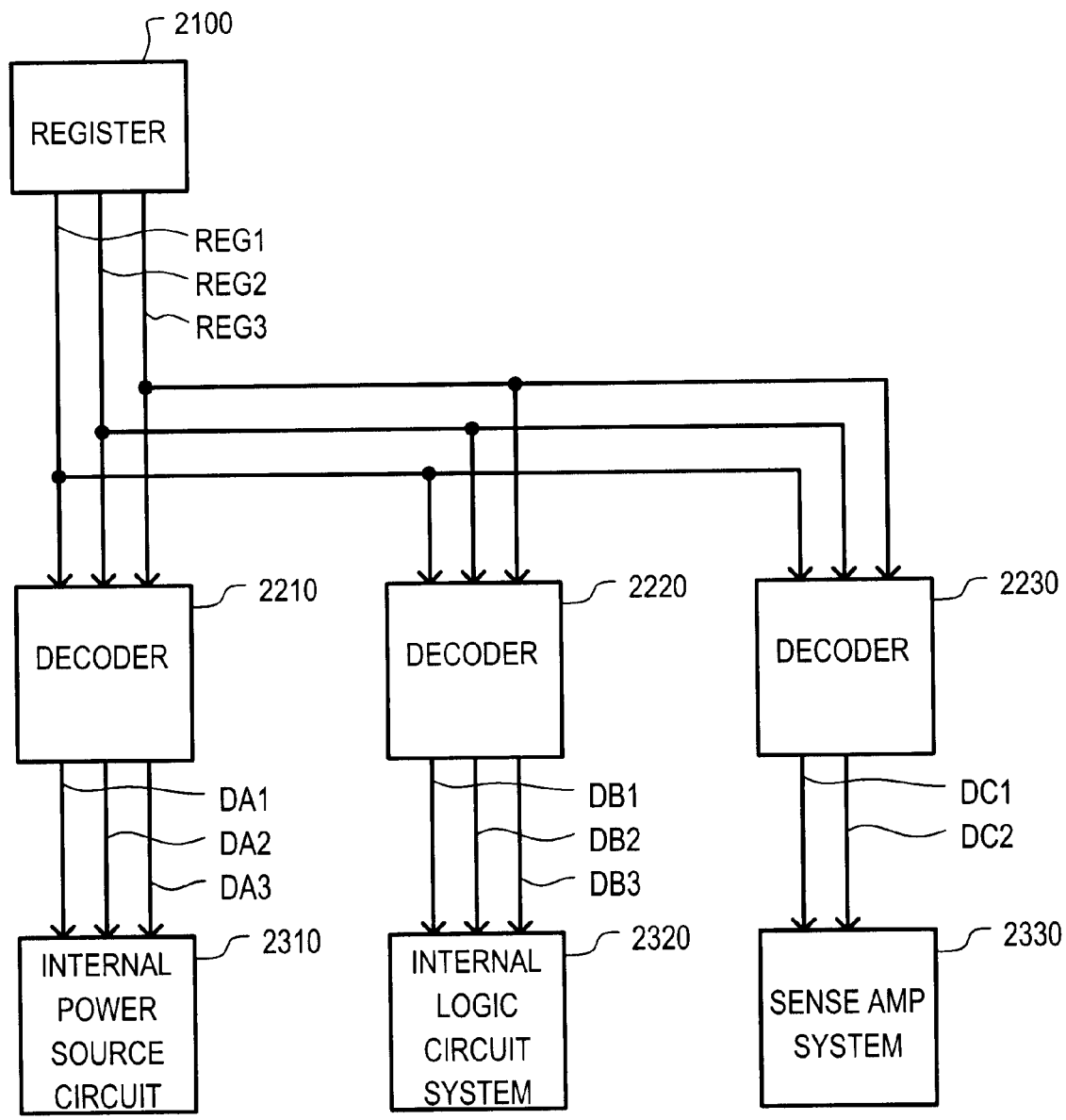
FIG. 10 is a block schematic diagram of a portion of semiconductor device according to a second embodiment.

Referring now to FIG. 10, a block schematic diagram of a portion of semiconductor device 100 according to the second embodiment is set forth.

The portion of semiconductor device 200 of FIG. 10 may include a register 2100, decoders (2210 to 2230), an internal power source circuit 2310, an internal logic circuit system 2320, and a sense amp system 2330. Internal power source circuit 2310, internal logic circuit system 2320, and sense amp system 2330 may be similar to internal power source circuit 1300, internal logic circuit system 1400, and sense amp system 1500 illustrated in the first embodiment.

Register 2100 may be provided in the high-speed interface circuit 110 (FIG. 1). Decoder 2210 may receive signals (REG1, REG2, and REG3) from register 2100 and may provide decode signals (DA1 to DA3) to internal power source circuit 2310. Decoder 2220 may receive signals (REG1, REG2, and REG3) from register 2100 and may provide decode signals (DB1 to DB3) to internal logic circuit system 2320. Decoder 2230 may receive signals (REG1, REG2, and REG3) from register 2100 and may provide decode signals (DC1 and DC2) to sense amp system 2330. In this way, changeover states of internal power source circuit 2310, internal logic circuit system 2320, and sense amp system 2330 may be controlled based upon a code set in register 2100 according to predetermined corresponding relationships. In this case, the predetermined corresponding relationships may be set in advance and may include a corresponding relationship between the operating frequency and the internal power supply voltage provided by internal power supply circuit 2310, a corresponding relationship between the operating frequency and the signal propagation delay in internal logic system circuit 2320, and a corresponding relationship between the operating frequency and the fixed current value supplied in sense amp system 2330. Each corresponding relationship may be set according to a selected operating frequency in order for the circuitry to operate in the most suitable manner.

Referring now to FIG. 11, a table illustrating register values (REG1, REG2, and REG3) and values of internal power supply voltage Vint, current Ic supplied in sense amp system 2330, and relative delay (tDLY) of sense amp activation signal timing for various operating frequencies (f1 to f8) according to the second embodiment. In the second embodiment, the external power source voltage may be 2.5 V, as just one example. The register values (REG1, REG2, and REG3) may be codes, which are set into register 2100 by a user.

The table of FIG. 11, shows that internal power supply voltage Vint may be set to 2.0 volts for operating frequencies (f1 to f4). Internal power supply voltage Vint may be set to 1.9 volts for operating frequencies (f5 to f7). Internal power supply voltage Vint may be set to 1.8 volts for operating frequency f8. Current Ic may be set to 3.0 milliamps (mA) for operating frequencies (f1 to f4) and may be set to 1.0 mA for operating frequencies (f5 to f8). Relative delay tDLY of sense amp activation signal timing may be set to +0.5 nanoseconds (ns) for operating frequencies (f1 to f3). Relative delay tDLY of sense amp activation signal timing may be set to 0.0 ns for operating frequencies (f4 and f5). Relative delay tDLY of sense amp activation signal timing may be set to −0.5 ns for operating frequencies (f6 to f8). The settings of values of internal power supply voltage Vint, current Ic supplied in sense amp system 2330, and relative delay (tDLY) of sense amp activation signal timing for various operating frequencies (f1 to f8) may be determined during the circuit design and development stage.

Figure 12:
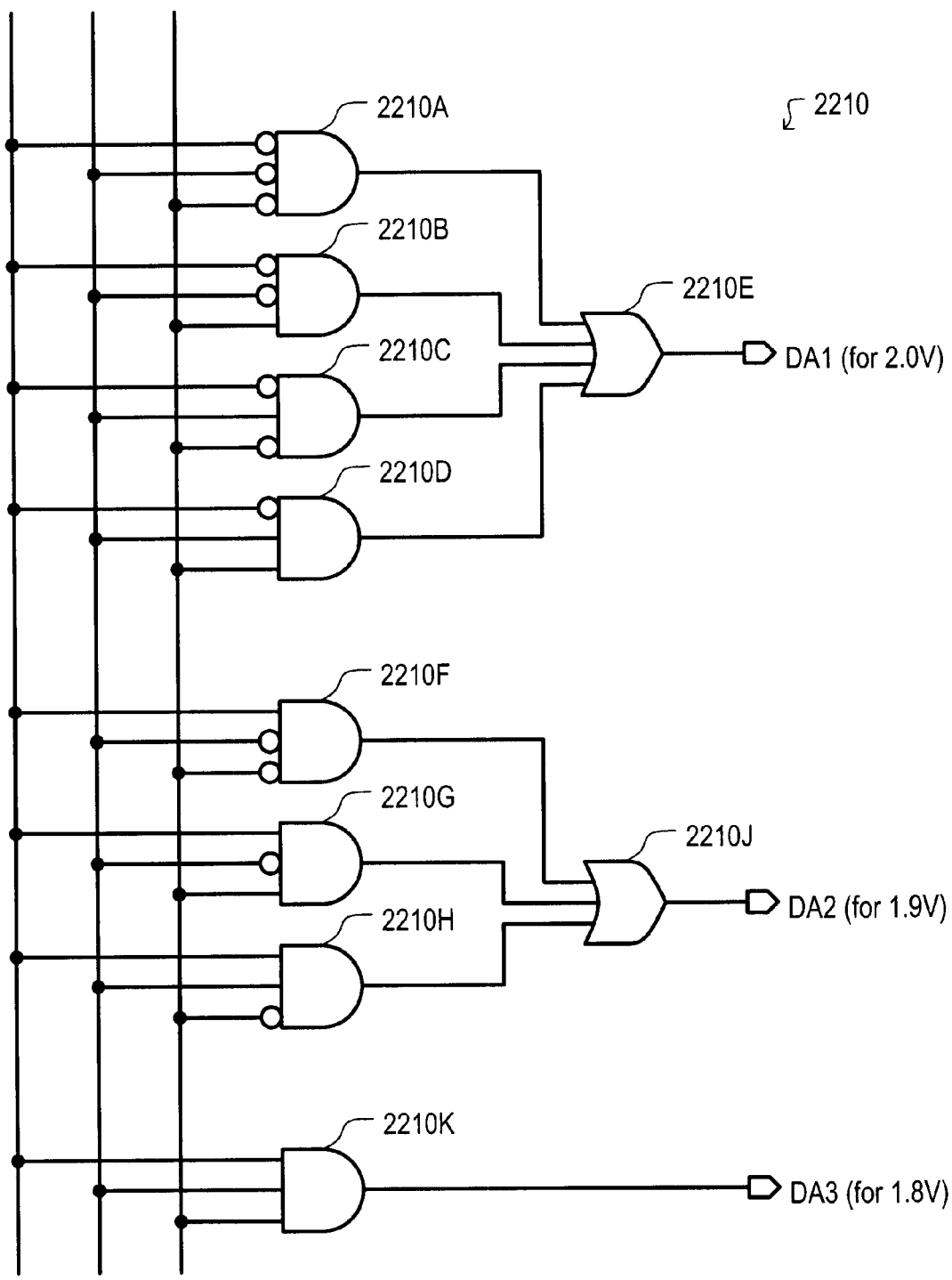
FIG. 12 is a circuit schematic diagram of a decoder according to the second embodiment.

Referring now to FIG. 12, a circuit schematic diagram of decoder 2210 according to the second embodiment is set forth.

Decoder 2210 may receive register values (REG1 to REG3) as inputs and may generated decoded signals (DA1 to DA3) as outputs in accordance to the corresponding relationship between the operating frequency (f1 to f8) and the internal power supply voltage Vint illustrated in the table of FIG. 11.

Decoder 2210 may include AND gates (2210A to 2210D, 2210F to 2210G, and 2210K) and OR gates (2210E and 2210J). A circle at an input of a NAND gate may indicate a logical inversion (negative logic) of the signal received.

AND gate 2210A may receive register values (REG1 to REG3) through negative logic as inputs and may provide an output to an input of OR gate 2210E. AND gate 2210B may receive register values (REG1 and REG2) through negative logic and register value REG3 as inputs and may provide an output to an input of OR gate 2210E. AND gate 2210C may receive register values (REG1 and REG3) through negative logic and register value REG2 as inputs and may provide an output to an input of OR gate 2210E. AND gate 2210D may receive register value REG1 through negative logic and register values (REG2 and REG3) as inputs and may provide an output to an input of OR gate 2210E. OR gate 2210E may generate decoded signal DA1 as an output. Decoded signal DA1 may be a control signal used to set internal power supply voltage Vint generated by internal power source circuit 2310 to 2.0 Volts. Decoded signal DA1 may be high when operating frequencies (f1 to f4) are selected and may be low when operating frequencies (f5 to f8) are selected.

AND gate 2210F receive register values (REG2 and REG3) through negative logic and register value REG1 as inputs and may provide an output to an input of OR gate 2210J. AND gate 2210G receive register value REG2 through negative logic and register values (REG1 and REG3) as inputs and may provide an output to an input of OR gate 2210J. AND gate 2210H receive register value REG3 through negative logic and register values (REG1 and REG2) as inputs and may provide an output to an input of OR gate 2210J. OR gate 2210J may generate decoded signal DA2 as an output. Decoded signal DA2 may be a control signal used to set internal power supply voltage Vint generated by internal power source circuit 2310 to 1.9 Volts. Decoded signal DA2 may be high when operating frequencies (f5 to f7) are selected and may be low when operating frequencies (f1 to f4 and f8) are selected.

AND gate 2210K receive register values (REG1 to REG3) as inputs and generate decoded signal DA3 as an output. Decoded signal DA3 may be a control signal used to set internal power supply voltage Vint generated by internal power source circuit 2310 to 1.8 Volts.

Figure 13:
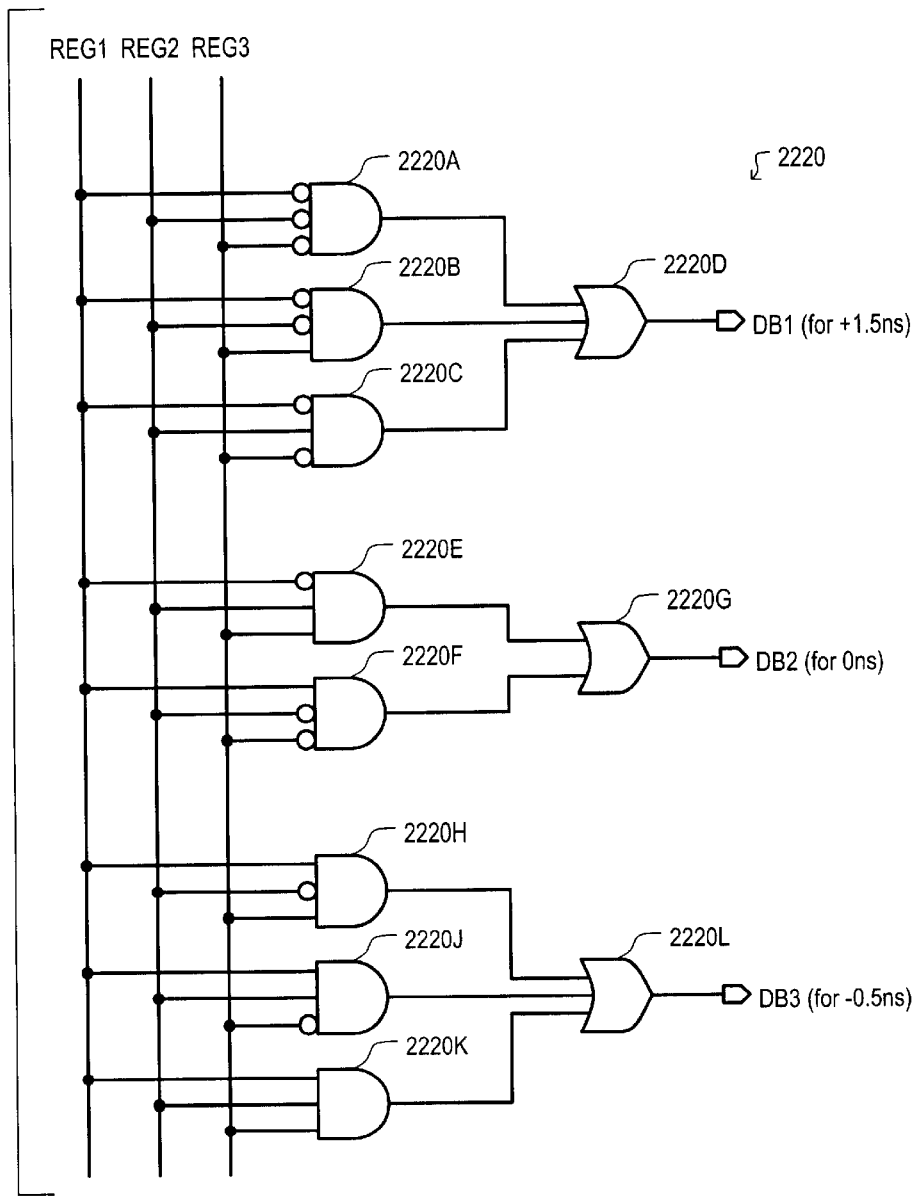
FIG. 13 is a circuit schematic diagram of a decoder according to the second embodiment.

Referring now to FIG. 13, a circuit schematic diagram of decoder 2220 according to the second embodiment is set forth.

Decoder 2220 may receive register values (REG1 to REG3) as inputs and may generated decoded signals (DB1 to DB3) as outputs in accordance to the corresponding relationship between the operating frequency (f1 to f8) and the relative delay (tDLY) of sense amp activation signal timing illustrated in the table of FIG. 11.

Decoder 2220 may include AND gates (2220A to 2220C, 2220E to 2220F, and 2220H to 2220K) and OR gates (2220D, 2220G, and 2220L). A circle at an input of a NAND gate may indicate a logical inversion (negative logic) of the signal received.

AND gate 2220A may receive register values (REG1 to REG3) through negative logic as inputs and may provide an output to an input of OR gate 2220D. AND gate 2220B may receive register values (REG1 and REG2) through negative logic and register value REG3 as inputs and may provide an output to an input of OR gate 2220D. AND gate 2220C may receive register values (REG1 and REG3) through negative logic and register value REG2 as inputs and may provide an output to an input of OR gate 2220D. OR gate 2220D may generate decoded signal DB1 as an output. Decoded signal DB1 may be a control signal used to set relative delay (tDLY) of sense amp activation signal timing generated by internal logic circuit system 2320 to +1.5 ns. Decoded signal DB1 may be high when operating frequencies (f1 to f3) are selected and may be low when operating frequencies (f4 to f8) are selected.

AND gate 2220E may receive register value REG1 through negative logic register values (REG2 and REG3) as inputs and may provide an output to an input of OR gate 2220G. AND gate 2220F may receive register values (REG2 and REG3) through negative logic and register value REG1 as inputs and may provide an output to an input of OR gate 2220G. OR gate 2220G may generate decoded signal DB2 as an output. Decoded signal DB2 may be a control signal used to set relative delay (tDLY) of sense amp activation signal timing generated by internal logic circuit system 2320 to 0.0 ns. Decoded signal DB2 may be high when operating frequencies (f4 and f5) are selected and may be low when operating frequencies (f1 to f3 and f6 to f8) are selected.

AND gate 2220H may receive register value REG2 through negative logic register values (REG1 and REG3) as inputs and may provide an output to an input of OR gate 2220L. AND gate 2220J may receive register value REG3 through negative logic register values (REG1 and REG2) as inputs and may provide an output to an input of OR gate 2220L. AND gate 2220K may receive register value (REG1 to REG3) as inputs and may provide an output to an input of OR gate 2220L. OR gate 2220L may generate decoded signal DB3 as an output. Decoded signal DB3 may be a control signal used to set relative delay (tDLY) of sense amp activation signal timing generated by internal logic circuit system 2320 to 0.5 ns. Decoded signal DB3 may be high when operating frequencies (f6 and f8) are selected and may be low when operating frequencies (f1 to f5) are selected.

Figure 14:
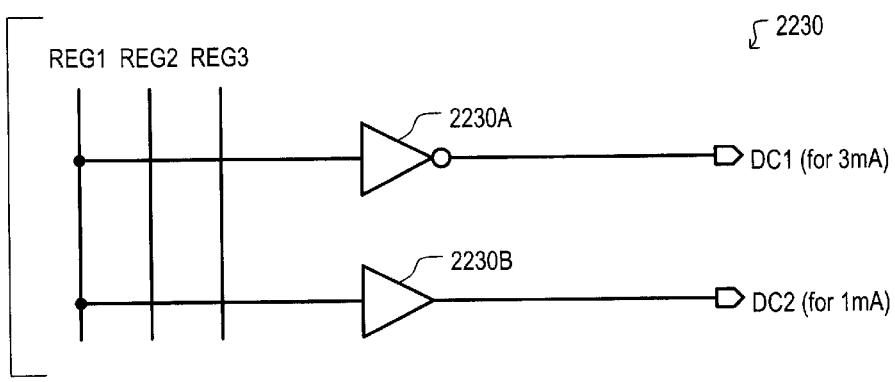
FIG. 14 is a circuit schematic diagram of a decoder according to the second embodiment.

Referring now to FIG. 14, a circuit schematic diagram of decoder 2230 according to the second embodiment is set forth.

Decoder 2230 may receive register value REG1 as an input and may generate decoded signals (DC1 and DC2) as outputs in accordance to the corresponding relationship between the operating frequency (f1 to f8) and current Ic supplied in sense amp system 2330 as illustrated in the table of FIG. 11. It is noted that register values (REG2 and REG3) may also be needed in cases in which the decoding may be more complicated.

Decoder 2230 may include an inverter 2230A and a buffer 2230B.

Inverter 2230A may receive register value REG1 as an input and may generate decoded signal DC1 as an output. Decoded signal DC1 may be a control signal used to set the current Ic supplied in sense amp system 2330 to 3.0 mA. Decoded signal DC1 may be high when operating frequencies (f1 to f4) are selected and may be low when operating frequencies (f5 to f8) are selected.

Buffer 2230B may receive register value REG1 as an input and may generate decoded signal DC2 as an output. Decoded signal DC2 may be a control signal used to set the current Ic supplied in sense amp system 2330 to 1.0 mA. Decoded signal DC2 may be high when operating frequencies (f5 to f8) are selected and may be low when operating frequencies (f1 to f4) are selected.

Is should be noted, internal power source circuit 2310, internal logic circuit system 2320, and sense amp system 2330 may be similar to internal power source circuit 1300, internal logic circuit system 1400, and sense amp system 1500 illustrated in the first embodiment. However, with regard to internal power source circuit 1300 illustrated in FIG. 4, decoded signals (D1 to D3) may be replaced with.decoded signals (DA1 to DA3), while the circuit elements associated with decoded signal D4 may be omitted. With regard to internal logic circuit system 1400 illustrated in FIG. 7, decoded signals (D1 to D3) may be replaced with decoded signals (DB1 to DB3), while the circuit elements associated with decoded signal D4 may be omitted. With regard to the portion of sense amp system 1500 illustrated in FIG. 8, decoded signals (D1 and D2) may be replaced with decoded signals (DC1 and DC3), while the circuit elements associated with decoded signals (D3 and D4) may be omitted.

The operation of the second embodiment will now be explained with regard to selecting the internal power supply voltage by internal power supply circuit 2310, selecting the delay value (tDLY) in internal logic circuit system 2320, and selecting the current value Ic in sense amp system 2330 in accordance with a selected operating frequency.

The user of semiconductor device 100 may provide register 2100 a code indicative of the desired operating frequency. This may be performed under the control of an external CPU, as just one example. Register 2100 may output register values (REG1 to REG3) indicative of the set code.

Decoder 2210 may decode register values (REG1 to REG3) and may output decoded signals (DA1 to DA3) in accordance with the relationship illustrated in the table of FIG. 11. If the desired operating frequency is operating frequency (f1 to f4), decoded signal DA1 may be high. If the desired operating frequency is operating frequency (f5 to f7), decoded signal DA2 may be high. If the desired operating frequency is operating frequency f8, decoded signal DA3 may be high.

Decoded signals (DA1 to DA3) may be received by internal power source system 2310 to select the appropriate internal power supply voltage Vint in accordance with the desired operating frequency (f1 to f8).

Decoder 2220 may decode register values (REG1 to REG3) and may output decoded signals (DB1 to DB3) in accordance with the relationship illustrated in the table of FIG. 11. If the desired operating frequency is operating frequency (f1 to f3), decoded signal DB1 may be high. If the desired operating frequency is operating frequency (f4 or f5), decoded signal DB2 may be high. If the desired operating frequency is operating frequency (f6 to f8), decoded signal DB3 may be high.

Decoded signals (DB1 to DB3) may be received by internal logic circuit system 2320 to select the appropriate delay value (tDLY) in accordance with the desired operating frequency (f1 to f8).

Decoder 2230 may decode register values (REG1 to REG3) and may output decoded signals (DC1 and DC2) in accordance with the relationship illustrated in the table of FIG. 11. If the desired operating frequency is operating frequency (f1 to f4), decoded signal DC1 may be high. If the desired operating frequency is operating frequency (f5 to f8), decoded signal DC2 may be high.

Decoded signals (DC1 and DC2) may be received by sense amp system 2330 to select the appropriate current value Ic in accordance with the desired operating frequency (f1 to f8).

In this manner, according to the second embodiment, internal power supply voltage Vint generated by internal power supply circuit 2310, the delay value (tDLY) in internal logic circuit system 2320, and the current value Ic in sense amp system 2330 may be independently modified in accordance with a selected operating frequency. For example, when changing between operating frequencies (f1 to f4) the delay value (tDLY) in internal logic circuit system 2320 may be different between frequencies (f1 to f3) and frequency f4, while the internal power supply voltage Vint, and the current value Ic in sense amp system 2330 may have the same values for all operating frequencies (f1 to f4). Thus, according to the second embodiment, it may be possible to perform the most appropriate modifications for each of the parameters in accordance with the desired operating frequency.

It is understood that the embodiments described above are exemplary and the present invention should not be limited to those embodiments. Specific structures should not be limited to the described embodiments.

For example, although the embodiments described above the parameters which may be modified in accordance with a desired operating frequency may include an internal power supply voltage, a delay path for an internal circuit, and a current supplied to a sense amp, the modifiable parameters should not be considered as being limited to these. Any parameters of any type of circuit may be modified provided that no deviation is made from the gist of the present invention.

Also, although in the embodiments described above, the example of a Rambus DRAM is used, the present invention may be applied to any type of semiconductor device.

Although desired operating frequencies are described, the invention may apply to allow circuit parameter modifications based on other desired operating parameters, such as temperature, external power supply, external signal interface, as just three examples.

N-type IGFETs and P-type IGFETs may be metal-oxide-semiconductor (MOS) FETs, as just one example.

Although specific frequencies were described, the code setting section may include codes in which each code indicates a frequency operating range in which device parameters or specifications may be achieved.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor device, comprising:
a code setting section having a code which indicates a desired operating frequency;
a power supply voltage section which selects a power supply voltage level based on the code; and
a delay section which selects a delay amount based on the code.

2. The semiconductor device of claim 1, further including:
a current providing section which selects a current value based on the code.

3. The semiconductor device of claim 1, further including:
a control section coupled to receive the code and provide decoded signals to the power supply voltage section to select the power supply voltage and the delay section to select the delay amount.

4. The semiconductor device of claim 3, wherein:
decoded signals include first decoded signals coupled to the power supply voltage section to select the power supply voltage and second decoded signals coupled to the delay section to select the delay amount.

5. The semiconductor device of claim 1, wherein the power supply voltage section includes:
a plurality of transfer gates which select between a plurality of power supply voltage levels based on the code value.

6. The semiconductor device of claim 5, wherein the power supply voltage section further includes:
a reference voltage generation section and the plurality of transfer gates selects between a plurality of power supply voltage levels by selecting a reference voltage based on the code value.

7. The semiconductor device of claim 5, further including:
a control section coupled to receive the code and provide decoded signals to the power supply voltage section to select the power supply voltage level; and
wherein each of the plurality of transfer gates include a transfer gate control terminal for controlling a transfer gate controllable impedance path and the power supply voltage section further includes a switch section which couples the decoded signals to selected transfer gate control terminals while setting unselected transfer gate control terminals to a predetermined logic level.

8. The semiconductor device of claim 7, wherein:
the transfer gate control terminals are selected by a plurality of programmable devices.

9. The semiconductor device of claim 7, wherein:
the transfer gate control terminals are selected by a mask programmable conductive layer.

10. The semiconductor device of claim 1, wherein:
the code is externally received during a code setting operation.

11. A semiconductor device, comprising:
a code setting section storing a code value indicating a desired device operating frequency;
a power supply circuit generating a power supply potential based on the code value; and
a logic circuit coupled to receive the power supply potential and modifying a timing of a logic signal based on the code value.

12. The semiconductor device of claim 11, wherein:
the timing of the logic signal is determined by configuring a signal propagation delay path in accordance with the code value.

13. The semiconductor device of claim 11, wherein the logic circuit includes:
a plurality of delay circuits providing different signal propagation delays; and
a plurality of switches selecting at least one of the plurality of delay circuits based on the code value.

14. The semiconductor device of claim 13, further including:
a control section coupled to receive the code value and provide decoded signals coupled to the logic circuit to select at least one of the plurality of delay circuits.

15. The semiconductor device of claim 1, wherein:
the logic signal is a sense amplifier activation signal.

16. A semiconductor device, comprising:
a code setting section outputting a code value indicating a desired device operating frequency;
a power supply circuit generating a power supply potential based on the code value; and
a first circuit coupled to receive the power supply potential and having an operating current based on the code value.

17. The semiconductor device of claim 16, wherein:
the first circuit includes a plurality of current sources; and
a plurality of transfer gates for selecting one of the plurality of current sources based on the code value.

18. The semiconductor device of claim 17, wherein:
each of the plurality of current sources includes an IGFET for supplying the operating current to the first circuit.

19. The semiconductor device of claim 16, further including:
a control section coupled to receive the code value and provide decoded signals coupled to the first circuit to select the operating current; and
the code setting section includes a register storing the code value.

20. The semiconductor device of claim 16, wherein:
the first circuit includes a differential amplifier and the semiconductor device is a semiconductor memory device.

* * * * *